(12) United States Patent
Yin et al.

(10) Patent No.: US 9,576,802 B2
(45) Date of Patent: Feb. 21, 2017

(54) SEMICONDUCTOR DEVICE AND METHOD FOR MANUFACTURING THE SAME

(76) Inventors: Haizhou Yin, Poughkeepsie, NY (US); Huilong Zhu, Poughkeepsie, NY (US); Keke Zhang, Liaocheng (CN)

(*) Notice: Subject to any disclaimer, the term of this patent is extended or adjusted under 35 U.S.C. 154(b) by 0 days.

(21) Appl. No.: 14/412,173

(22) PCT Filed: Jul. 19, 2012

(86) PCT No.: PCT/CN2012/078839
§ 371 (c)(1),
(2), (4) Date: Dec. 30, 2014

(87) PCT Pub. No.: WO2014/005361
PCT Pub. Date: Jan. 9, 2014

(65) Prior Publication Data
US 2015/0340456 A1    Nov. 26, 2015

(30) Foreign Application Priority Data

Jul. 3, 2012   (CN) .......................... 2012 1 0229543

(51) Int. Cl.
| | |
|---|---|
| H01L 21/331 | (2006.01) |
| H01L 21/28 | (2006.01) |
| H01L 29/66 | (2006.01) |
| H01L 21/3105 | (2006.01) |
| H01L 29/78 | (2006.01) |
| H01L 29/423 | (2006.01) |
| H01L 29/417 | (2006.01) |

(52) U.S. Cl.
CPC ... *H01L 21/28114* (2013.01); *H01L 21/28088* (2013.01); *H01L 21/31051* (2013.01); *H01L 29/42376* (2013.01); *H01L 29/6653* (2013.01); *H01L 29/66545* (2013.01); *H01L 29/78* (2013.01); *H01L 29/41783* (2013.01); *H01L 29/66628* (2013.01)

(58) Field of Classification Search
CPC ............... H01L 21/28114; H01L 21/31051; H01L 21/28088; H01L 29/42376; H01L 29/66545; H01L 29/78; H01L 29/6653; H01L 29/41783; H01L 29/66628
USPC .......................................... 438/301; 257/288
See application file for complete search history.

(56) References Cited

U.S. PATENT DOCUMENTS

| | | | | |
|---|---|---|---|---|
| 2002/0142529 A1* | 10/2002 | Matsuda | ............... | H01L 21/266 438/175 |
| 2013/0082311 A1* | 4/2013 | Cheng | ................. | H01L 29/7834 257/288 |
| 2013/0146959 A1* | 6/2013 | Cheng | ............... | H01L 29/66181 257/310 |

FOREIGN PATENT DOCUMENTS

| | | |
|---|---|---|
| CN | 102386085 A | 3/2012 |
| CN | 102479692 A | 5/2012 |

* cited by examiner

*Primary Examiner* — Vongsavanh Sengdara

(57) ABSTRACT

A method for manufacturing a semiconductor device is disclosed. The method comprises: forming a T-shape dummy gate structure on the substrate; removing the T-shape dummy gate structure and retaining a T-shape gate trench; forming a T-shape metal gate structure by filling a metal layer in the T-shape gate trench. According to the semiconductor device manufacturing method disclosed in the present application, the overhang phenomenon and the formation of voids are avoided in the subsequent metal gate filling process by forming a T-shape dummy gate and a T-shape gate trench, and the device performance is improved.

10 Claims, 4 Drawing Sheets

SEMICONDUCTOR DEVICE AND METHOD FOR MANUFACTURING THE SAME

CROSS-REFERENCE TO RELATED APPLICATION

This application is a national stage application, filed under 35 U.S.C. §371, of PCT Application No. PCT/CN2012/078839, filed on Jul. 19, 2012, entitled "SEMICONDUCTOR DEVICE AND METHOD FOR MANUFACTURING THE SAME", which claimed priority to Chinese Application No. 201210229543.1, filed on Jul. 3, 2012, all of which are hereby incorporated by reference in their entirety.

TECHNICAL FIELD

The present disclosure relates to a semiconductor device and a method for manufacturing the same, and in particular, to a semiconductor device manufacturing method, in which voids are avoided to form in the metal gate, and a semiconductor device manufactured using the same.

BACKGROUND

With the scaling of MOSFET feature size, the requirements for the gate insulated isolation effect and the control ability of gate to channel region gets higher and higher. The conventional silicon oxide insulation layer could not continuously provide enough insulated isolation when its depth becomes thinner gradually, while the polysilicon gate could not precisely control the work function to adjust the device threshold voltage. Currently the high k-metal gate structure, which uses high k materials as gate insulation layer and filled metal materials as gate conductive layer, becomes the mainstream in MOSFET. Because the high k materials can easily react at high temperatures or under ion bombardment, the development of gate-first process, in which the gate stack structure is deposited first and then the S/D region is formed by ion implantation and activation annealing, is restricted. The gate-last process, in which a dummy gate stack is deposited first and the S/D region is formed by ion implantation, and then the dummy gate is etched to form gate trench and the gate stack is deposited in the gate trench, gradually dominates.

However, with further decrease in size, the aspect ratio of the gate trench becomes bigger continuously for smaller device. The gate trench filling in gate-last process becomes a major bottleneck in process development. As disclosed in the US 2012/012948 A1, because the width of the gate trench is too narrow compared to its depth, the first layer metal materials will form a "overhang" at the top edge of the gate trench when depositing the work function adjusting layer/metal blocking layer, i.e. the first metal layer will form a local protrusion that is toward the gate trench center and beyond the gate spacer at the top edge. The second layer metal materials will close and end deposition filling earlier due to this local protrusion in the subsequent metal filling layer deposition, and accordingly form voids caused by incompletely filling in the middle and bottom parts. These voids cause unnecessary increase in metal gate resistance and lower the device performance.

SUMMARY OF THE DISCLOSURE

From the above, the purpose of the present disclosure is to provide a semiconductor device manufacturing method, in which voids are avoided to form in the metal gate, and a semiconductor device manufactured using the same.

According to one aspect of the present disclosure, a method for manufacturing a semiconductor device is provided, comprising: forming a T-shape dummy gate structure on the substrate; removing the T-shape dummy gate structure and retaining a T-shape gate trench; forming a T-shape metal gate structure by filling a metal layer in the T-shape gate trench.

The steps of forming the T-shape dummy gate structure further comprise: forming a dummy gate stack structure consisting of a gate insulation layer and a dummy gate layer on the substrate; forming a gate spacer on both sides of the dummy gate stack structure with the height of the gate spacer less than the height of the dummy gate stack structure to expose the top of the dummy gate stack structure; forming a dummy gate epitaxial layer on both the exposed top and side of the dummy gate stack structure, where the dummy gate epitaxial layer and the dummy gate layer constitute together the T-shape dummy gate structure.

An S/D epitaxial layer is formed on both sides of gate spacer at the same time when the dummy gate epitaxial layer is formed.

An S/D heavily doped region is formed by doping the S/D epitaxial layer at the same time or after the S/D epitaxial layer is formed.

The step of forming the gate spacer further comprises: forming a spacer material layer on the substrate and on the dummy gate layer; over etching the spacer material layer so that the height of the formed gate spacer is less than the height of the dummy gate stack structure.

An S/D extension region and/or a halo-S/D region is formed on the substrate on both sides of the dummy gate stack structure after the dummy gate stack structure is formed and before the gate spacer is formed.

An interlayer dielectric layer is formed on the substrate and is planarized until the T-shape dummy gate structure is exposed after the T-shape dummy gate structure is formed and before the T-shape dummy gate structure is removed.

The metal layer comprises a work function adjusting layer and a metal gate filling layer.

The work function adjusting layer comprises TiN, TaN, and combinations thereof, and the metal gate filling layer comprises Ti, Ta, W, Al, Cu, Mo, and combinations thereof.

The gate insulation layer comprises high k materials.

The dummy gate layer comprises polycrystalline silicon, amorphous silicon, microcrystalline silicon, amorphous carbon, hydrogenated amorphous carbon, and combinations thereof.

The gate spacer comprises silicon nitride, silicon oxynitride, DLC, and combinations thereof.

The width difference between the top and bottom of the T-shape dummy gate structure is no greater than the width of the gate spacer.

According to another aspect of the present disclosure, a semiconductor device is also provided, comprising: a substrate, a gate insulation layer with high k materials on the substrate, a T-shape metal gate structure on the gate insulation layer, and an S/D region on both sides of the T-shape metal gate structure.

According to the semiconductor device manufacturing method disclosed in the present application, the overhang phenomenon and the formation of voids are avoided in the subsequent metal gate filling process by forming a T-shape dummy gate and a T-shape gate trench, and the device performance is improved.

BRIEF DESCRIPTION OF THE DRAWINGS

The technical solution of the present disclosure is described in detail with reference to the following attached drawings, in which.

DETAILED DESCRIPTION

Figure 1:
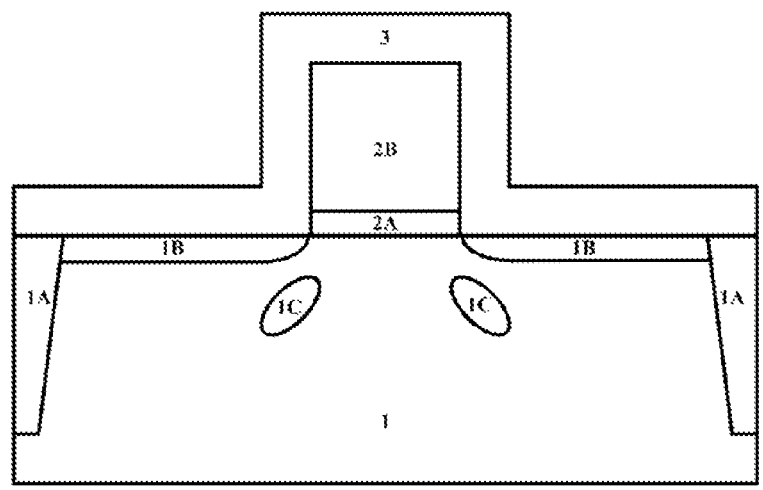
FIGS. 1-9 are schematic cross-sectional views of various stages for manufacturing the semiconductor device according to the present disclosure.

The characteristics of the technical solutions and the technical effect of the present disclosure will be described in detail with reference to the attached drawings in combination with the exemplary embodiments to disclose a semiconductor device manufacturing method, in which voids are avoided to form in the metal gate, and a semiconductor device manufactured using the same. It should be noted that similar reference numerals denote similar structures in the drawings. The terms of first, second, above, below, etc. can be used to describe various device structures or process steps. The description does not imply the relationship of space, order, or hierarchy between device structures or process steps unless otherwise indicated.

FIGS. 1-9 are schematic cross-sectional views of various stages for manufacturing the semiconductor device according to the present disclosure.

As illustrated in FIG. 1, a dummy gate stack structure 2 is formed on the substrate 1, and a spacer material layer 3 is formed on the dummy gate stack structure 2 and the substrate 1. The substrate 1 is provided, such as silicon-based materials comprising bulk silicon (Si), silicon on insulator (SOI), SiGe, SiC, strained silicon, silicon nanotubes, etc. In addition, the substrate 1 can also be other semiconducting materials such as Ge, GeOI, SiGe, Group III-V compound, Group II-VI compound. Preferably, bulk silicon or SOI can be chosen as the substrate 1 in order to be compatible with CMOS processes. Preferably, an insulation region 1A constituted of corresponding oxide materials to the substrate 1 (such as insulation materials silicon oxide, etc.) is formed, for example, a shallow trench insulation (STI) 1A is formed by etching and deposition on the substrate 1, where STI 1A surrounds and defines the device active region. As illustrated in FIG. 1, a gate insulation layer 2A, a dummy gate layer 2B and a dummy gate stack subsequently formed by etching are deposited successively on the substrate 1 (in the active region) using conventional methods such as LPCVD, HDP-CVD, ALD, MBE, cathode-ray deposition, sputtering, ion beam deposition, MVPECV, RFPECVD, etc. The gate insulation layer 2A can be conventional silicon oxide, which is used as an oxide liner to protect the substrate channel region from over etching in the gate-last process. The gate insulation layer is formed by removing the dummy gate layer 2B and the gate insulation layer 2A to form a gate trench and then refill it with high k materials. The gate insulation layer 2A can also be high k materials, which are not removed after forming and are retained directly as the gate insulation layer 2A. The high k materials may comprise, but are not limited to, nitride (such as SiN, AlN, TiN), metal oxide (mainly sub-group and lanthanide metal oxides such as $Al_2O_3$, $Ta_2O_5$, $TiO_2$, ZnO, $ZrO_2$, $HfO_2$, $CeO_2$, $Y_2O_3$, $La_2O_3$), perovskite phase oxide (such as $PbZr_xTi_{1-x}O_3$ (PZT), $Ba_xSr_{1-x}TiO_3$ (BST)). The dummy gate layer 2B can be silicon-based materials or carbon-based materials comprising polycrystalline silicon, amorphous silicon, microcrystalline silicon, amorphous carbon, hydrogenated amorphous carbon, and combinations thereof. Preferably, the dummy gate layer 2B uses similar materials as the substrate 1, i.e. silicon-based materials, with different crystal configurations. The width and depth of the gate insulation layer 2A and the dummy gate layer 2B are determined according to requirements for device performance. A lightly doped S/D extension region (LDD) 1B and/or a halo S/D doped region 1C are formed by using the dummy gate stack 2A/2B as a mask and performing the first S/D ion implantation in the substrate active region on both sides of the dummy gate stack structure. The type, dose, and energy of the doping ions are determined by the MOSFET type and the junction depth, and are not listed herein. By using conventional methods such as LPCVD, HDPCVD, ALD, MBE, cathode-ray deposition, sputtering, ion beam deposition, MVPECV, RFPECVD, etc., a spacer material layer 3 is formed on the entire device, i.e., on the dummy gate stack structure 2 and the substrate 1 on both sides. The materials for the spacer material layer 3 are, for example, silicon nitride, silicon oxynitride, diamond-like amorphous carbon (DLC), and combinations thereof. The spacer material layer 3 may provide insulation of sidewalls of the gate, and may preferably apply stress to improve charge carrier mobility in the channel region. In such a case, as illustrated in FIG. 1, the spacer material layer 3 covers the STI 1A, the S/D extension region 1B, and the dummy gate layer 2B.

Figure 2:
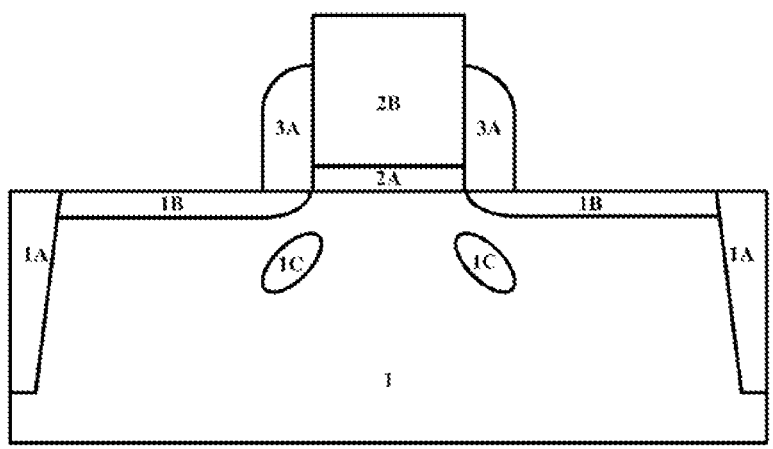

As illustrated in FIG. 2, a gate spacer 3A is formed by etching the spacer material layer 3, where the height of gate spacer 3A is less than the height of the dummy gate stack structure 2. By using the anisotropic dry etching process including plasma etching, reactive ion etching (RIE) and/or isotropic wet etching process to etch the spacer material layer 3, and by preferably performing over etching (such as 5~10%), the height of the gate spacer 3A after etching may be less than the height of the dummy gate stack structure 2, i.e., the top of the gate spacer 3A is lower than the top of the dummy gate layer 2B, so as to expose part of the region (top and side) on top of the dummy gate layer 2B for later epitaxy. As illustrated in FIG. 2, the height of the exposed dummy gate layer 2B can be less than ⅓ of the overrall height of the dummy gate layer 2B, preferably, ¼~⅙, for better controlling the shape of the epitaxial region and the shape of the T-shape dummy gate and the T-shape gate trench.

Figure 3:
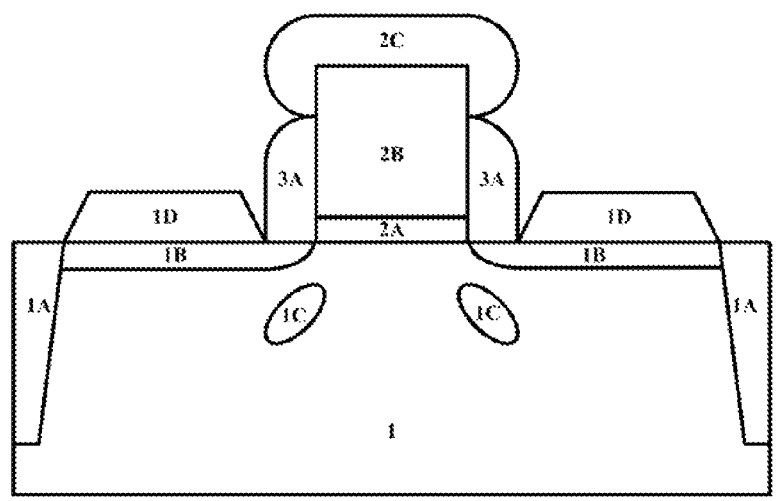

As illustrated in FIG. 3, a T-shape dummy gate structure is formed. For example, a dummy gate epitaxial layer 2C and an S/D epitaxial layer 1D are formed on top of the dummy gate layer 2B and the S/D extension region 1B, respectively, by selective epitaxial growth. When both the dummy gate layer 2B and the substrate 1 (S/D extension region 1B) are formed of silicon-based materials, the dummy gate epitaxial layer 2C and the S/D epitaxial layer 1D made of silicon materials should be selectively epitaxial grown on the top of both simultaneously, wherein the dummy gate epitaxial layer 2C and the dummy gate layer 2B together constitute the T-shape dummy gate structure to avoid the overhang phenomenon and the formation of voids, and the S/D epitaxial layer 1D and S/D extension region 1B constitute the S/D enhancement region 1D to reduce the S/D contact resistance. When materials for the dummy gate layer 2B and the substrate 1 are different, for example, the dummy gate layer 2B is formed of carbon-based materials and the substrate 1 is formed of silicon-based materials, the dummy gate epitaxial layer 2C and the S/D extension layer 1D can be selectively epitaxial grown in two steps. For example, the dummy gate epitaxial layer 2C and the dummy gate layer 2B are both formed of amorphous carbon or hydrogenated amorphous carbon, and the S/D epitaxial layer 1D and the substrate 1 (S/D extension region 1B) are both formed of silicon-based materials (polycrystalline silicon, amorphous silicon), germanium-based materials (polycrystalline germanium, amorphous germanium) or similar compound materials. Preferably, in order to improve the S/D region doping concentration and to reduce the S/D region contact resistance, in-situ doping can be applied to the S/D extension layer 1D simultaneously with the epitaxial growth to obtain the S/D heavily doped region 1D with higher doping concentration, or the S/D heavily doped region (not shown) can also be formed from the S/D extension region (and the part of substrate below) by applying an additional ion implantation process.

Figure 4:
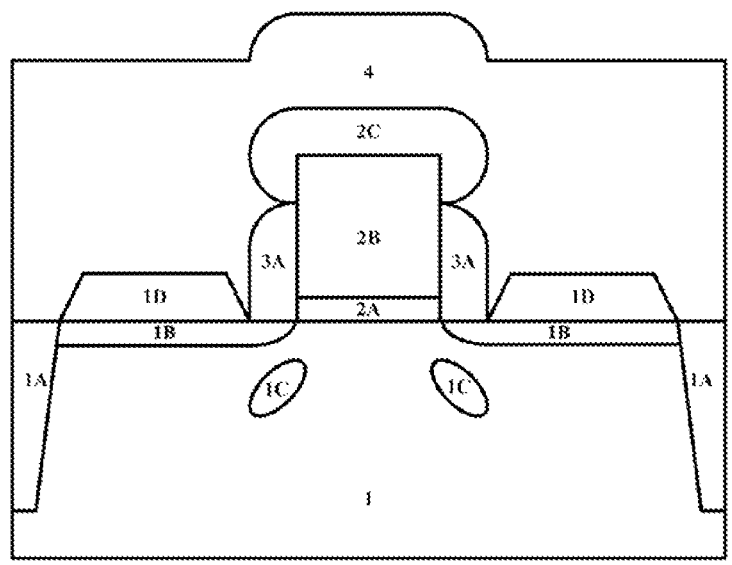

As illustrated in FIG. 4, an interlayer dielectric layer 4 is formed on the entire device structure by deposition. The interlayer dielectric layer (ILD) 4 can be formed with low k materials by methods such as LPCVD, PECVD, spin coating, spraying, screen printing, etc., where the low k materials may comprise, but are not limited to, organic low k materials (such as organic polymers containing aryl or multi-ring), inorganic low k materials (such as amorphous carbon nitride films, polycrystalline boron nitride films, fluorine-silica glass, BSG, PSG, BPSG), porous low k materials (such as silsesquioxane (SSQ)-based porous low k materials, porous silicon dioxide, porous SiOCH, C-doped silicon dioxide, F-doped porous amorphous carbon, porous diamond, porous organic polymers). Preferably, ILD4 is silicon oxide or silicon oxynitride.

Figure 5:
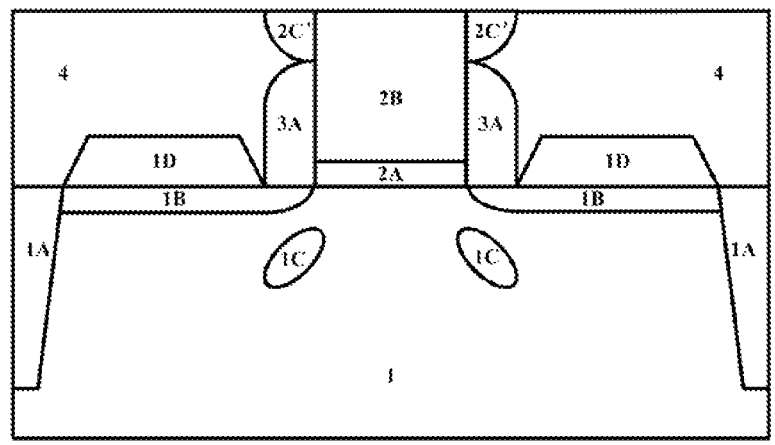

As illustrated in FIG. 5, ILD4 can be planarized by over etching or CMP until the dummy gate layer 2B is exposed. In such a case, as illustrated in FIG. 5, the part of the dummy gate epitaxial layer 2C on top of the dummy gate layer 2B is removed and the part of the dummy gate epitaxial layer 2C' on sidewalls of the dummy gate layer 2B is retained, where 2C' and 2B together constitute the T-shape dummy gate structure. It is difficult to suppress the overhang phenomenon when the width difference between the top and bottom of the T-shape dummy gate structure and the height difference between the gate spacer 3A and the dummy gate stack structure 2 is too small. However, when the width difference is too large (for example, larger than the width of the gate spacer 3A), parasitic capacitance may increase due to large overlapping between the gate and the S/D region in top view, which may decrease device performance. In addition, when the height difference between the bottom of the dummy gate epitaxial layer 2C' and the bottom of the dummy gate layer 2B is too large, the gate spacer 3A is usually etched too severely to provide sheltering. Therefore, preferably, this height difference and/or width difference should not be greater than the width of the gate spacer 3A. Specifically, the aforementioned height difference and/or width difference may be about 0.5~1 times of the width of the gate spacer 3A.

Figure 6:
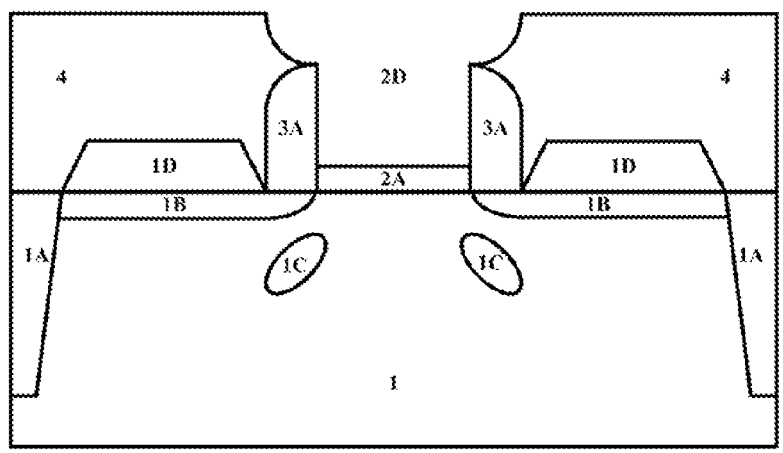

As illustrated in FIG. 6, the T-shape dummy gate structure 2B/2C' is etched and the T-shape gate trench 2D is retained. The T-shape dummy gate structure can be removed by either wet or dry etching, with different solutions or gases for different materials. For example, for dry etching, halogen-based gases can be used for etching the T-shape dummy gate structure constituted of dummy gate epitaxial layer 2C' and dummy gate layer 2B both formed of silicon-based materials, and oxygen plasma can be used for etching T-shape dummy gate structure formed of carbon-based materials to remove the dummy gate and form the gate trench 2D. Particularly, when the gate insulation layer 2A is silicon oxide, of which the oxide liner is formed, the gate insulation layer 2A can be removed together until the substrate 1 (channel region) is exposed and the high k materials can be deposited subsequently. When the gate insulation layer 2A itself is formed of high k materials, the etching of the gate trench stops at the top surface of the gate insulation layer 2A.

Figure 7:
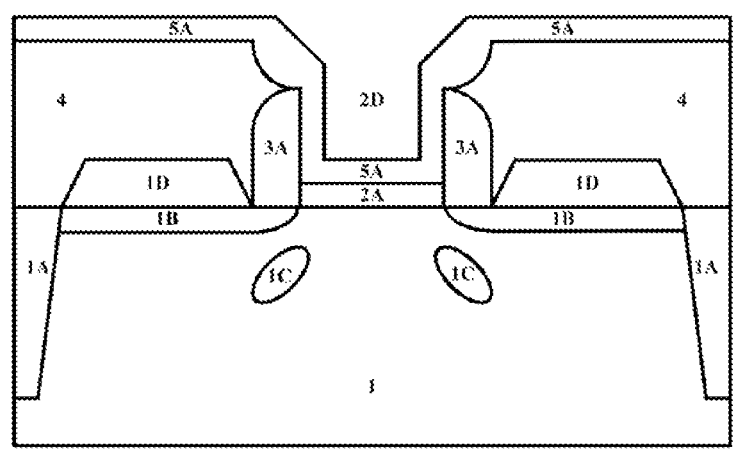

As illustrated in FIG. 7, a first metal layer 5 is formed on the entire device. The first metal layer 5A is formed by deposition in ILD4 and the T-shape gate trench 2D as a work function adjusting layer or a metal blocking layer by methods such as sputtering, MOCVD, ALD, etc. The materials for the first metal layer 5A can be TiN, TaN, and combinations thereof, and the depth may be determined according to requirements for work function adjusting. It should be noted that the overhang phenomenon will not happen during the deposition of the first metal layer 5A due to the special morphology of the T-shape gate trench.

Figure 8:
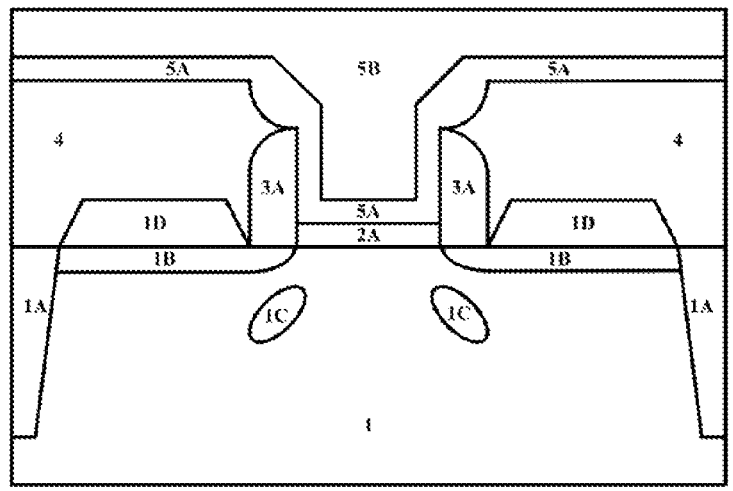

As illustrated in FIG. 8, the second metal layer 5B is deposited on the first metal layer 5A. The second metal layer 5B is formed on the first metal layer 5A (and filled in the gate trench later) as metal gate filling layer with the materials such as Ti, Ta, W, Al, Cu, Mo, etc. and combinations thereof, by methods such as sputtering, MOCVD, ALD, etc. Since overhang phenomenon does not happen in deposition of the first metal layer 5A as illustrated in FIG. 7, the second metal layer 5B can be filled completely in the remaining part of the gate trench without forming any voids in the gate, which ensures that the gate resistance will not increase and the device performance may be improved. As illustrated in FIG. 8, the first metal layer 5A and the second metal layer 5B together constitute the T-shape metal gate structure that is conformal with the T-shape gate trench.

Figure 9:
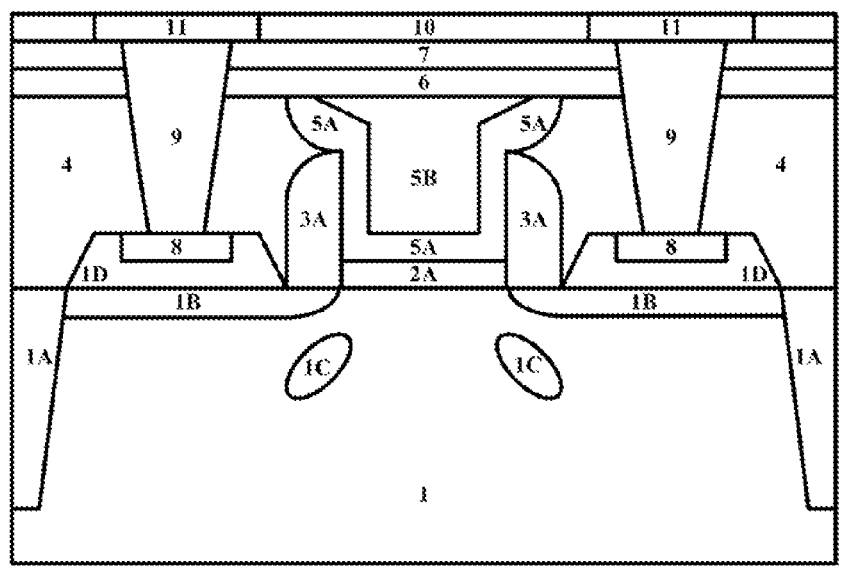

Finally, as illustrated in FIG. 9, subsequent processes are performed. A contact etch stop layer (CESL) 6, which may be formed of materials such as SiN, SiON, is deposited on the entire device, an S/D contact hole is formed by depositing the second ILD7 and etching the second ILD7, CESL6 and ILD4, a metallization layer 8 (metal silicide such as NiSi, PtSi, CoSi, etc.) is formed on/in the S/D epitaxial layer 1D exposed in the S/D contact hole to reduce the S/D contact resistance, an S/D contact plug 9 is formed by filling metals and/or metal nitrides, a lead hole is formed by depositing and etching the third ILD 10, a lead 11 is formed by filling metal in the lead hole to constitute a word line or a bit line of the device, and finally manufacturing of the device structure is finished. As illustrated in FIG. 9, the final MOSFET device structure may comprise at least the substrate 1, the gate insulation layer 2A on the substrate 1, the T-shape metal gate structure 5A/5B, the S/D region (the S/D extension region 1B, the halo-S/D region 1C and the S/D epitaxial layer 1D) on both sides of the T-shape metal gate structure, and the metallization layer 8 on the S/D region. The structure and corresponding materials for other components of the MOSFET are described in detail in the above method description, and are not listed herein.

According to the semiconductor device manufacturing method disclosed in the present application, the overhang phenomenon and the formation of voids may be avoided in the subsequent metal gate filling process by forming a T-shape dummy gate and a T-shape gate trench, and the device performance is improved.

Although the present application has been already illustrated according to the above one or more examples, it will be appreciated that numerous modifications and embodiments may be devised by the skilled in the art without deviating the scope of the present application. Furthermore, it may be devised from the teaches of the disclosure changes suitable for special situation or materials without deviating the scope of the present application. Therefore, objects of the disclosure are not limited to special examples for preferred embodiments, meanwhile structure of the device and manufacture method thereof cover all embodiments fall into the scope of the present application.

We claim:

1. A method for manufacturing a semiconductor device, comprising:
    forming a T-shape dummy gate structure on a substrate;
    removing the T-shape dummy gate structure to form a T-shape gate trench; and
    forming a T-shape metal gate structure by filling a metal layer in the T-shape gate trench wherein the step of forming the T-shape dummy gate structure further comprises:
    forming a dummy gate stack structure consisting of a gate insulation layer and a dummy gate layer on the substrate;
    forming a gate spacer on both sides of the dummy gate stack structure, and the height of the gate spacer is less than the height of the dummy gate structure to expose the top of the dummy gate structure; and
    forming a dummy gate epitaxial layer on both the exposed top and side of the dummy gate stack structure, wherein the dummy gate epitaxial layer and the dummy gate layer together constitute the T-shape dummy gate structure,
    wherein an S/D epitaxial layer is formed on both sides of gate spacer when the dummy gate epitaxial layer is formed.

2. The method according to claim 1, wherein an S/D heavily doped region is formed by doping the S/D epitaxial layer at the same time when or after the S/D epitaxial layer is formed.

3. The method according to claim 1, wherein the step of forming the gate spacer further comprises:
    forming a spacer material layer on the substrate and on the dummy gate layer; and
    over etching the spacer material layer so that the height of the formed gate spacer is less than the height of the dummy gate stack structure.

4. The method according to claim 1, wherein an S/D extension region or a halo-S/D region is formed on the substrate on both sides of the dummy gate stack structure after the dummy gate stack structure is formed and before the gate spacer is formed.

5. The method according to claim 1, wherein an interlayer dielectric layer is formed on the substrate and is planarized until the T-shape dummy gate structure is exposed after the T-shape dummy gate structure is formed and before the T-shape dummy gate structure is removed.

6. The method according to claim 1, wherein the metal layer comprises a work function adjusting layer and a metal gate filling layer.

7. The method according to claim 6, wherein the work function adjusting layer comprises TiN, TaN, and combinations thereof, and the metal gate filling layer comprises Ti, Ta, W, Al, Cu, Mo, and combinations thereof.

8. The method according to claim 1, wherein the gate insulation layer comprises high k materials.

9. The method according to claim 1, wherein the dummy gate layer comprises polycrystalline silicon, amorphous silicon, microcrystalline silicon, amorphous carbon, hydrogenated amorphous carbon, and combinations thereof.

10. The method according to claim 1, wherein the gate spacer comprises silicon nitride, silicon oxynitride, DLC, and combinations thereof.

* * * * *